(12) United States Patent
Bains et al.

(10) Patent No.: US 10,141,935 B2
(45) Date of Patent: Nov. 27, 2018

(54) PROGRAMMABLE ON-DIE TERMINATION TIMING IN A MULTI-RANK SYSTEM

(71) Applicant: Intel Corporation, Santa Clara, CA (US)

(72) Inventors: Kuljit S Bains, Olympia, WA (US); Alexey Kostinsky, Nahariya (IL); Nadav Bonen, Ofer (IL)

(73) Assignee: Intel Corporation, Santa Clara, CA (US)

( * ) Notice: Subject to any disclaimer, the term of this patent is extended or adjusted under 35 U.S.C. 154(b) by 210 days.

(21) Appl. No.: 14/865,866

(22) Filed: Sep. 25, 2015

(65) Prior Publication Data

US 2017/0093400 A1 Mar. 30, 2017

(51) Int. Cl.
| | | |
|---|---|---|
| *G06F 13/00* | (2006.01) | |
| *G11C 7/00* | (2006.01) | |
| *H03K 17/16* | (2006.01) | |
| *H03K 19/003* | (2006.01) | |
| *H03K 19/0175* | (2006.01) | |
| *G06F 3/06* | (2006.01) | |
| *G06F 13/16* | (2006.01) | |

(52) U.S. Cl.
CPC ..... *H03K 19/017545* (2013.01); *G06F 3/061* (2013.01); *G06F 3/0629* (2013.01); *G06F 3/0673* (2013.01); *G06F 13/1668* (2013.01)

(58) Field of Classification Search
CPC . G11C 7/1045; G11C 2207/2272; G11C 7/22; G11C 11/4076; G11C 8/18
USPC .............................. 710/316; 365/194; 326/30
See application file for complete search history.

(56) References Cited

U.S. PATENT DOCUMENTS

| | | |
|---|---|---|
| 6,880,094 B2 | 4/2005 | LaBerge |
| 7,342,412 B2 | 3/2008 | Kim |
| 8,274,308 B2 | 9/2012 | McCall et al. |
| 8,363,508 B2 | 1/2013 | Fujisawa |
| 8,988,101 B2 | 3/2015 | Song et al. |
| 9,001,594 B2 | 4/2015 | Bringivijayaraghavan |
| 9,153,296 B2 | 10/2015 | McCall et al. |
| 9,292,391 B2 | 3/2016 | Ojalvo et al. |
| 9,385,719 B2 | 7/2016 | Shaeffer |
| 9,524,255 B2 | 12/2016 | Zhu et al. |
| 9,536,591 B1 | 1/2017 | Kwak |

(Continued)

OTHER PUBLICATIONS

International Search Report and Written Opinion for PCT Patent Application No. PCT/US2016/047511, dated Nov. 18, 2016, 15 pages.

*Primary Examiner* — Faisal M Zaman
(74) *Attorney, Agent, or Firm* — Compass IP Law PC

(57) ABSTRACT

On-die termination (ODT) control enables programmable ODT latency settings. A memory device can couple to an associated memory controller via one or more buses shared by multiple memory devices organized ranks of memory. The memory controller generates a memory access command for a target rank. In response to the command, memory devices can selectively engage ODT for the memory access operation based on being in the target rank or a non-target rank, and based on whether the access command includes a Read or a Write. The memory device can engage ODT in accordance with a programmable ODT latency setting. The programmable ODT latency setting can set different ODT timing values for Read and Write transactions.

22 Claims, 10 Drawing Sheets

(56) References Cited

U.S. PATENT DOCUMENTS

| | | | |
|---|---|---|---|
| 2001/0003198 A1* | 6/2001 | Wu | G06F 13/4243 711/104 |
| 2006/0158214 A1* | 7/2006 | Janzen | G11C 7/1051 326/30 |
| 2006/0267633 A1* | 11/2006 | King | H03K 19/018521 326/83 |
| 2007/0126465 A1* | 6/2007 | Cox | G06F 13/4086 326/30 |
| 2007/0279084 A1* | 12/2007 | Oh | G06F 13/4086 326/30 |
| 2008/0272800 A1* | 11/2008 | Haig | H03K 19/0005 326/30 |
| 2008/0290894 A1* | 11/2008 | Sohn | G11C 7/1051 326/30 |
| 2009/0230989 A1* | 9/2009 | Murayama | G06F 13/1668 326/26 |
| 2010/0070690 A1* | 3/2010 | Amer | G11C 7/1051 711/103 |
| 2010/0082911 A1* | 4/2010 | Das | G11C 7/02 711/154 |
| 2010/0208535 A1* | 8/2010 | Fujisawa | G11C 7/1066 365/193 |
| 2011/0116330 A1* | 5/2011 | Kim | G11C 7/22 365/194 |
| 2011/0128794 A1* | 6/2011 | Yoon | G11C 7/1051 365/189.05 |
| 2011/0205832 A1* | 8/2011 | Jeon | G11C 7/1057 365/233.16 |
| 2011/0299348 A1* | 12/2011 | Park | G11C 7/1051 365/193 |
| 2012/0008433 A1* | 1/2012 | Yoon | G11C 7/22 365/194 |
| 2012/0254873 A1* | 10/2012 | Bringivijayaraghavan | G11C 7/109 718/102 |
| 2012/0326746 A1* | 12/2012 | McCall | G11C 7/1045 326/30 |
| 2013/0031326 A1* | 1/2013 | Grunzke | G11C 5/04 711/167 |
| 2013/0117599 A1* | 5/2013 | Mochida | G11C 11/4076 713/503 |
| 2013/0162288 A1* | 6/2013 | Song | H03K 19/018557 326/30 |
| 2013/0257474 A1* | 10/2013 | Kang | H03K 19/0005 326/30 |
| 2013/0339775 A1* | 12/2013 | Shaeffer | G11C 7/1072 713/323 |
| 2013/0342254 A1* | 12/2013 | Mazumder | H03H 11/26 327/276 |
| 2014/0002131 A1* | 1/2014 | Shaeffer | G11C 5/063 326/30 |
| 2014/0028345 A1* | 1/2014 | Oh | H03K 19/017545 326/30 |
| 2014/0152340 A1* | 6/2014 | Cho | H03K 19/0005 326/30 |
| 2014/0229666 A1* | 8/2014 | Schoenborn | G11C 29/06 711/105 |
| 2014/0281205 A1* | 9/2014 | Shaeffer | G11C 7/1072 711/106 |
| 2014/0300371 A1* | 10/2014 | Pickerd | G01R 13/02 324/537 |
| 2015/0279444 A1 | 10/2015 | Vergis et al. | |
| 2015/0317096 A1 | 11/2015 | Bains | |
| 2016/0028395 A1* | 1/2016 | Bains | H03K 19/0005 326/30 |
| 2016/0087630 A1* | 3/2016 | Park | H03K 19/0005 326/30 |
| 2016/0134285 A1* | 5/2016 | Ha | H03K 19/00369 326/30 |

\* cited by examiner

COMMAND TABLE 400

| COMMAND | SDR CMD PINS | | SDR CA PINS | | | | | | | CK EDGE |
|---|---|---|---|---|---|---|---|---|---|---|
| | CKE | | | | | | | | | |
| | CK_t (n-1) | CK_t (n) | CS | CA0 | CA1 | CA2 | CA3 | CA4 | CA5 | |
| MRW-1 | H | H | H | L | H | H | L | L | OP7 | 1↑ |
| | | | L | MA0 | MA1 | MA2 | MA3 | MA4 | MA5 | 2↑ |
| MRW-2 | H | H | H | L | H | H | L | H | OP6 | 1↑ |
| | | | L | OP0 | OP1 | OP2 | OP3 | OP4 | OP5 | 2↑ |
| MRR-1 | H | H | H | L | H | H | H | L | V | 1↑ |
| | | | L | MA0 | MA1 | MA2 | MA3 | MA4 | MA5 | 2↑ |
| REFRESH (ALL/PER BANK) | H | H | H | L | L | L | H | L | AB | 1↑ |
| | | | L | BA0 | BA1 | BA2 | V | V | V | 2↑ |
| ENTER SELF REFRESH | H | H | H | L | L | L | H | H | V | 1↑ |
| | | | L | V | V | V | V | V | V | 2↑ |
| ACTIVATE-1 | H | H | H | H | L | R12 | R13 | R14 | R15 | 1↑ |
| | | | L | BA0 | BA1 | BA2 | V | R10 | R11 | 2↑ |
| ACTIVATE-2 | H | H | H | H | H | R6 | R7 | R8 | R9 | 1↑ |
| | | | L | R0 | R1 | R2 | R3 | R4 | R5 | 2↑ |
| WRITE-1 | H | H | H | L | L | H | L | L | BL | 1↑ |
| | | | L | BA0 | BA1 | BA2 | V | C9 | AP | 2↑ |
| EXIT SELF REFRESH | H | H | H | L | L | H | L | H | V | 1↑ |
| | | | L | V | V | V | V | V | V | 2↑ |
| MASK WRITE-1 | H | H | H | L | L | H | H | L | BL | 1↑ |
| | | | L | BA0 | BA1 | BA2 | V | C9 | AP | 2↑ |
| RFU | H | H | H | L | L | H | H | H | V | 1↑ |
| | | | L | V | V | V | V | V | V | 2↑ |
| READ-1 | H | H | H | L | H | L | L | L | BL | 1↑ |
| | | | L | BA0 | BA1 | BA2 | V | C9 | AP | 2↑ |
| CAS-2 | H | H | H | L | H | L | L | H | C8 | 1↑ |
| | | | L | C2 | C3 | C4 | C5 | C6 | C7 | 2↑ |
| PRECHARGE (ALL/PER BANK) | H | H | H | L | L | L | L | H | AB | 1↑ |
| | | | L | BA0 | BA1 | BA2 | V | V | V | 2↑ |

FIG. 4A

REGISTER 410

| ODT VALUE CONTROL FOR DQ ODT | | | |
|---|---|---|---|
| OP2 | OP1 | OP0 | VALUE |
| 0 | 0 | 0 | DISABLE |
| 0 | 0 | 1 | RZQ |
| 0 | 1 | 0 | RZQ/2 |
| 0 | 1 | 1 | RZQ/3 |
| 1 | 0 | 0 | RZQ/4 |
| 1 | 0 | 1 | RZQ/5 |
| 1 | 1 | 0 | RZQ/6 |
| 1 | 1 | 1 | RFU |

FIG. 4B

REGISTER 430

| ODT TIMING CONTROL FOR DQ ODT | | | |
|---|---|---|---|
| ADDR | OP | ODT STATE | VALUE |
| 432 | WR | ON | OFFSET 442: ENABLE BEFORE WL |
| 434 | WR | OFF | OFFSET 444: DISABLE AFTER WL |
| 436 | RD | ON | OFFSET 446: ENABLE BEFORE CL |
| 438 | RD | OFF | OFFSET 448: DISABLE AFTER CL |

FIG. 4D

COMMAND TABLE 420

| | SDR CMD PINS | | SDR CA PINS | | | | | | | |
|---|---|---|---|---|---|---|---|---|---|---|
| | CKE | | | | | | | | | |
| COMMAND | CK_t (n-1) | CK_t (n) | CS | CA0 | CA1 | CA2 | CA3 | CA4 | CA5 | CK EDGE |
| WRITE-1 | H | H | H | L | L | H | L | L | BL | 1↑ |
| | | | L | BA0 | BA1 | BA2 | WR A/B | C9 | AP | 2↑ |
| READ-1 | H | H | H | L | H | L | L | L | BL | 1↑ |
| | | | L | BA0 | BA1 | BA2 | RD A/B | C9 | AP | 2↑ |

FIG. 4C

PROGRAMMABLE ON-DIE TERMINATION TIMING IN A MULTI-RANK SYSTEM

FIELD

Embodiments of the invention are generally related to memory devices, and more particularly to dynamically, selectively controlling on-die termination for memory access operations in a system with a multi-rank memory architecture.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2015, Intel Corporation, All Rights Reserved.

BACKGROUND

Memory devices are ubiquitous in computing devices to store data and code for a processor to execute operations and accomplish the functioning of computing devices. Even as the demand for computing devices grows, there is a trend towards smaller computing devices that operate on less power, especially in mobile devices. As mobile computing devices have increased in computational performance, they have included more and more storage and memory to meet the growing processing and execution performed on the devices. In mobile computing devices, controlling power consumption is a key design focus. Memory devices and memory subsystems consume a significant amount of total power consumption in low power and other mobile devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4A is a representation of an embodiment of command encoding for controlling on-die termination for memory access.

FIG. 4B is a representation of an embodiment of a table for controlling on-die termination value for memory access.

FIG. 4C is a representation of an embodiment of memory access command encoding for controlling on-die termination timing for memory access.

FIG. 4D is a representation of an embodiment of a table for controlling on-die termination timing for memory access.

Figure 1:
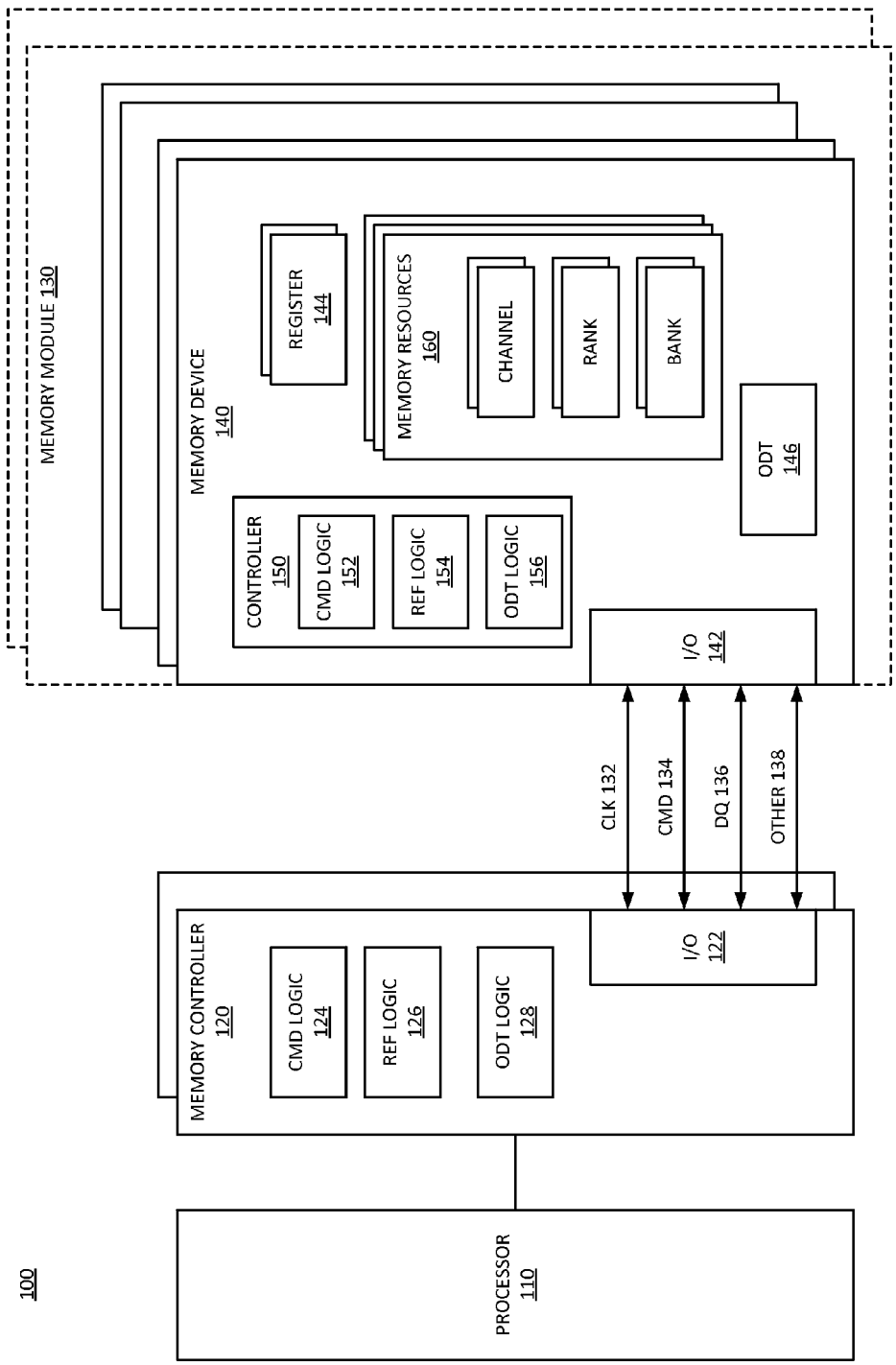
FIG. 1 is a block diagram of an embodiment of a system that applies selective control of on-die termination (ODT), including ODT timing control.

Descriptions of certain details and implementations follow, including a description of the figures, which may depict some or all of the embodiments described below, as well as discussing other potential embodiments or implementations of the inventive concepts presented herein.

DETAILED DESCRIPTION

Current memory subsystems can control memory system power consumption by eliminating on-die termination (ODT) during Write operations. While the signal quality might be degraded due to a lack of ODT, such a tradeoff can be tolerated if the distance between memory devices is small enough that the signal reflections do not significantly impact the desired signal. Such assumptions do not always hold in current systems. While some packaging solutions exist to increase the memory density in mobile device while maintaining distances between devices small, such solutions tend to be more costly and non-standard. More standard packaging solutions are less costly, but increase the distances between memory devices on the memory bus as densities increase. Thus, the distances between memory devices can cause signal degradation due to signal reflections without ODT in standard packaging solutions. Additionally, signal reflections can increase in non-symmetric packaging and/or with asymmetrical loading.

Current ODT solutions use ODT pins, which increase manufacturing cost and consume more real estate as it increases pin count. Some ODT solutions exist that do not use separate ODT pins, but such solutions are limited to providing termination in one rank, such as by hard-coding the termination scheme. Single-rank ODT is not a sufficient solution for multi-rank memory systems.

Current ODT solutions also provide a fixed value for ODT turn on and off timings that memory devices derive from configuration settings for read and write latencies. The use of fixed ODT turn on and turn off timings can degrade signal quality when topology routing is not matched, or load is not matched, or both.

As described herein, on-die termination (ODT) control enables programmable ODT latency settings. A memory device can couple to an associated memory controller via one or more buses shared by multiple memory devices organized ranks of memory. The memory controller generates a memory access command for a target rank. In response to the command, memory devices can selectively engage ODT for the memory access operation based on being in the target rank or a non-target rank, and based on whether the access command includes a Read or a Write. The memory device can engage ODT in accordance with a programmable ODT latency setting. The programmable ODT latency setting can set different ODT timing values for Read and Write transactions.

A rank of memory refers to a number of memory devices or chips that all receive and respond to a common command from an associated memory controller or comparable control unit. A rank of memory includes one or more memory devices connected in parallel. The memory devices in the rank typically share a data bus, C/A (command/address) bus, and a generally share clock signals. The separate devices in a rank can receive dedicated clock enable (CKE), chip select (CS), and on die termination (ODT) signals. The memory controller refers to a circuit and/or device that controls access to the memory devices.

The memory controller sends a memory access command concurrently to some or all of the ranks of memory. The memory controller can selectively trigger the memory ranks to change an on-die termination (ODT) setting, such as engaging ODT for a Write operation, engaging ODT for a Read operation, and/or changing a value of ODT for a Read or Write operation. More specifically, in one embodiment, the memory controller selectively triggers one or more non-target rank(s) to engage ODT. The memory device can engage ODT in accordance with one or more timing settings, which control when to turn on and turn off ODT. With programmable ODT timing settings, the memory device can engage ODT only as needed, by timing the turning on and turning off of the ODT specifically to engage ODT only at necessary times. It will be understood that ODT refers to connecting impedance between a power supply rail and the signal line at the receiver side. In one embodiment, the power supply rail is VDD or the high voltage supply. In one embodiment, a memory device can terminate from the signal line to VSS or ground or the low voltage supply. In one embodiment, a memory device can terminate the signal line to both VDD and VSS. In any scenario, one of the ranks is selected to execute the memory access command, which rank can be referred to as the target of the memory access command. The target rank executes the command while the other triggered ranks maintain the changed ODT setting for the memory access operation. Ranks that are addressed but not selected as the target rank can be referred to as non-target ranks.

Some ODT implementations, such as traditional LPDDR4 implementations, define a fixed value for ODT turn on and turn off timings that the DRAM or memory device derives from a mode register setting for read and write latencies. Some ODT implementations, such as DDR3, LPDDR3, and DDR4, use a special ODT control signal to control latencies. With a fixed value for turn on and turn off timings, the topology of the layout of the memory devices must be perfectly matched for both trace routing between devices, as well as loading of access of the devices. The programmable timing setting or settings described herein allow for mismatch in topology by enabling the programming of ODT timing. The mismatch in timing can include balanced topologies with unbalanced loading, unbalanced topologies, and/or daisy chain topologies. In one embodiment, by providing programmable timing settings allows for ODT adjustments to compensate for unbalanced loading.

In one embodiment, the system provides programmable timing settings via a programmable latency value in one or more registers of the memory device (e.g., a mode register), or in one or more storage locations of a single register. In one embodiment, a register can store a value indicating an offset to adjust timing for turn on or turn off. In one embodiment, the memory controller can program an offset configuration via a mode register set (MRS) command or comparable mechanism to write configuration settings. In one embodiment, the system provides programmable timing settings via memory access command encoding. In one embodiment, a memory device can be configured for one or more settings based on an indication in a memory access command. Thus, the memory controller can trigger the application of an ODT timing setting by encoding within a memory access command, and the memory device will access a register or other configuration storage to access the configuration setting.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory devices. In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "DRAM" can apply to any memory device that allows random access, whether volatile or nonvolatile. The memory device or DRAM can refer to the die itself and/or to a packaged memory product.

Low Power Double Data Rate 4 (LPDDR4) is one example of memory technology designed for modern computing systems. While some memory technologies implement wider I/O (input/output) interfaces, some technologies such as LPDDR4 are designed to have a narrower interface but still allow increased memory densities. Multi-device packaging can be used in technologies that seek to increase density while keeping a narrow I/O interface. While reference is made specifically to a memory device, and certain examples to LPDDR4 memory, it will be understood that inter-chip communication of all types is significant in modern computing systems. Thus, the descriptions herein can apply equally well to memory technologies not specifically identified, and can also apply to inter-device communication for devices of any type that share a common bus to devices in multi-device packaging.

LPDDR4 illustrates an example of a system in which multi-cycle commands can be used. For LPDDR4, a Write command includes two cycles of Write-1 followed by two cycles of CAS-2. The basic principle behind multi-cycle commands is to broadcast the command (e.g., a Write-1 command) to multiple ranks by asserting a Chip Select (CS) signal on the initial command. In one embodiment, the memory devices that receive Write-1 commands (e.g., those selected with a CS signal) turn on ODT for the duration of the write transaction. The memory controller sends a CAS-2 command only to the rank receiving the data or the target rank. Thus, the target rank receives a Write-1 and a CAS-2 signal, while the non-target rank(s) receive a Write-1 but not a CAS-2 signal. A similar approach can be applied to Read transactions, by sending Read-1 with CAS-2 to the target rank, and Read-1 without CAS-2 to non-target rank(s).

FIG. 1 is a block diagram of an embodiment of a system that applies selective control of on-die termination (ODT), including ODT timing control. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single and/or a multicore processing unit. The processing unit can be a primary processor such as a CPU (central processing unit) and/or a peripheral processor such as a GPU (graphics processing unit). System 100 can be implemented as an SOC, or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory devices 140. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. In one embodiment, settings for each channel are controlled by separate mode register or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a system bus. I/O interface logic 122 (as well as I/O 142 of memory device 140) can include pins, connectors, signal lines, and/or other hardware to connect the devices. I/O interface logic 122 can include a hardware interface. Typically, wires within an integrated circuit interface with a pad or connector to interface to signal lines or traces between devices. I/O interface logic 122 can include drivers, receivers, transceivers, termination, and/or other circuitry to send and/or receive signal on the signal lines between the devices. The system bus can be implemented as multiple signal lines coupling memory controller 120 to memory devices 140. The system bus includes at least clock (CLK) 132, command/address (CMD) 134, data (DQ) 136, and other signal lines 138. The signal lines for CMD 134 can be referred to as a "C/A bus" (or ADD/CMD bus, or some other designation indicating the transfer of commands and address information) and the signal lines for DQ 136 be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert *lines, auxiliary lines, and other signal lines.

It will be understood that the system bus includes a data bus (DQ 136) configured to operate at a bandwidth. Based on design and/or implementation of system 100, DQ 136 can have more or less bandwidth per memory device 140. For example, DQ 136 can support memory devices that have either a x32 interface, a x16 interface, a x8 interface, or other interface. The convention "xN," where N is a binary integer refers to an interface size of memory device 140, which represents a number of signal lines DQ 136 that exchange data with memory controller 120. The interface size of the memory devices is a controlling factor on how many memory devices can be used concurrently per channel in system 100 or coupled in parallel to the same signal lines.

Memory devices 140 represent memory resources for system 100. In one embodiment, each memory device 140 is a separate memory die, which can include multiple (e.g., 2) channels per die. Each memory device 140 includes I/O interface logic 142, which has a bandwidth determined by the implementation of the device (e.g., x16 or x8 or some other interface bandwidth), and enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. Typically memory resources 160 are managed as rows of data, accessed via cacheline (rows) and bitline (individual bits within a row) control. Memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry for the sub-banks.

In one embodiment, memory devices 140 include one or more registers 144. Registers 144 represent storage devices or storage locations that provide configuration or settings for the operation of the memory device. In one embodiment, registers 144 can provide a storage location for memory device 140 to store data for access by memory controller 120 as part of a control or management operation. In one embodiment, registers 144 include Mode Registers. In one embodiment, registers 144 include multipurpose registers. The configuration of locations within register 144 can configure memory device 140 to operate in a different "mode," where command and/or address information or signal lines can trigger different operations within memory device 140 depending on the mode. Settings of register 144 can indicate configuration for I/O settings (e.g., timing, termination or ODT (on-die termination), driver configuration, and/or other I/O settings.

In one embodiment, memory device 140 includes ODT 146 as part of the interface hardware associated with I/O 142. ODT 146 can be configured as mentioned above, and provide settings for impedance to be applied to the interface to specified signal lines. The ODT settings can be changed based on whether a memory device is a selected target of an access operation or a non-target device. ODT 146 settings can affect the timing and reflections of signaling on the terminated lines. Careful control over ODT 146 can enable higher-speed operation.

Memory device 140 includes controller 150, which represents control logic within the memory device to control internal operations within the memory device. For example, controller 150 decodes commands sent by memory controller 120 and generates internal operations to execute or satisfy the commands. Controller 150 can determine what mode is selected based on register 144, and configure the access and/or execution of operations for memory resources 160 based on the selected mode. Controller 150 generates control signals to control the routing of bits within memory device 140 to provide a proper interface for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 includes command logic 152 to receive and decode command and address information received via I/O 142 from memory controller 120. Based on the received command and address information, controller 150 can control the timing of operations of the logic and circuitry within memory device 140 to execute the commands. Controller 150 is responsible for compliance with standards or specifications.

In one embodiment, memory controller 120 includes refresh (REF) logic 126. Refresh logic 126 can be used where memory devices 140 are volatile and need to be refreshed to retain a deterministic state. In one embodiment, refresh logic 126 indicates a location for refresh, and a type of refresh to perform. Refresh logic 126 can trigger self-refresh within memory device 140, and/or execute external refreshes by sending refresh commands. External refreshes from the memory controller can include all bank refreshes and/or per bank refreshes. All bank refreshes cause the refreshing of a selected bank within all memory devices 140 coupled in parallel. Per bank refreshes cause the refreshing of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In one embodiment, memory controller 120 includes ODT logic 128 to control ODT applied to memory access transactions sent to memory device 140. In one embodiment, ODT logic 128 enables memory controller 120 to set one or more configuration settings for ODT value to be applied by memory device 140 based on transaction type (e.g., Write or Read). In one embodiment, ODT logic 128 enables memory controller 120 to set one or more configuration settings for ODT timing or latency to be applied by memory device 140. The timing or latency parameters can affect when memory device 140 turns ODT on (engages ODT) and turns ODT off (disengages ODT).

In one embodiment, the latency parameters can be different for target and non-target ranks of memory devices. In one embodiment, the latency parameters can be different for Write and for Read transactions. In one embodiment, the ODT timings can be different for different bit units or segments of a bus, such as different bytes, nibbles, or other portions of a bus. In one embodiment, the ODT timings can be different for different DRAMs or different memory device chips or dies. Thus, for example, different DRAMs on the same bus, channel, and/or rank can have different ODT timings. Such timings can be different based on the layout of the interconnections, which can cause slightly different delays in signal propagation. Thus, in one embodiment, each portion of a bus and/or each connection to the bus can be controlled with separate ODT timings. For example, memory subsystems where per DRAM access (PDA) is enabled can separately define ODT timings for each DRAM. Such control can be performed with one or more PDA commands, and/or for the use of PDA commands. In accordance with programmable ODT timing, ODT can be applied only as needed, and in accordance with the timing of when it is needed, which can save power in the system. If the memory devices can delay when to turn on and/or when to turn off ODT, they can prevent engaging ODT when it is not needed.

In one embodiment, controller 150 of memory device 140 includes ODT logic 156 to selectively apply ODT based on commands received from memory controller 120. For example, memory controller 120 can send a memory access command that command logic 152 decodes. Based on decoding the command, ODT logic 156 can selectively engage and/or disengage ODT 146 for one or more portions of I/O 142. In one embodiment, one or more registers 144 store ODT timing parameters for ODT 146. In one embodiment, one or more registers 144 (not necessarily the same register(s), but potentially the same register(s)), store ODT value parameters for ODT 146. The ODT value parameters indicate what amount of impedance to engage, while the timing parameters can indicate when to turn ODT on and off. ODT logic 156 can apply ODT 146 based on a command received, in accordance with one or more ODT settings stored in register 144. In one embodiment, ODT logic 156 applies different timing parameters for a Read transaction versus a Write transaction. In one embodiment, ODT logic 156 applies different timing parameters depending on whether the memory device is part of a target rank or a non-target rank.

In one embodiment, memory devices 140 can operate in accordance with an implementation of LPDDR4 or a variant or derivative. As mentioned above, LPDDR4 uses multi-cycle commands. In one embodiment, when memory devices 140 receive a Write-1 command, they turn on ODT 146 for the duration of the write transaction. The timing can be relative to a parameter WL, referring here to a Write latency. The duration of the write transaction includes the period of the command itself, including the cycles on a data bus where the memory controller provides the data to write, as well as preamble and postamble values for writes. The preamble includes a period of time prior to the first edge of the write data. The postamble includes a period of time after the last falling edge of the write data. Typically, the preamble precedes a write burst (e.g., 8 bits of data), and the postamble follows the write burst. In one embodiment, programmable ODT timing parameters enable memory devices 140 to control when to engage ODT relative to the preamble (e.g., within a time to settle the impedance prior to receipt of data), and when to disengage ODT relative to the postamble (e.g., allowing sufficient time for proper sampling of the data).

What is described for Writes can also be applied in similar fashion for Reads. In one embodiment, memory devices 140 of target and non-target ranks receive Read-1, and only the target rank receives a CAS-2 command. In one embodiment, the target rank disables its ODT on Read, and a memory device of a non-target rank that only receives the Read-1 command will provide ODT termination based on CL or a latency associated with a Read transaction (e.g., CAS latency). The duration of the Read transaction includes the period of time when the fetched data is provided by the memory device to the memory controller, as well as the Read preamble and Read postamble values that are programmed in a register.

Traditional memory subsystems can control memory system power consumption by eliminating the use of ODT during a Write. It will be understood that entirely eliminating ODT is distinguished from selectively applying ODT as described herein. While the signal quality might be degraded due to a lack of ODT in the traditional Write case, such a tradeoff can be tolerated if the distance between memory devices is small enough that the signal reflections do not significantly impact the desired signal. Such assumptions are not always valid in current systems, especially where multi-device packaging is used. While some traditional packaging solutions exist to increase the memory density in mobile device while maintaining sufficiently small distances between the devices to preserve the assumptions, as memory densities increase such solutions tend to be more costly and non-standard. More standard and less costly packaging solutions also exist, but increase the distances between memory devices on the memory bus as densities increase, which does not preserve the assumptions. Thus, the distances between memory devices in standard packaging solutions can cause signal degradation due to signal reflections without ODT. However, by selectively applying ODT on Write (or similarly selectively de-applying ODT on Read), such standard packaging solutions can be used even with increased memory densities. By programming the timing parameters of turning ODT on and off, the system can further control the effectiveness of selective ODT.

Figure 2:
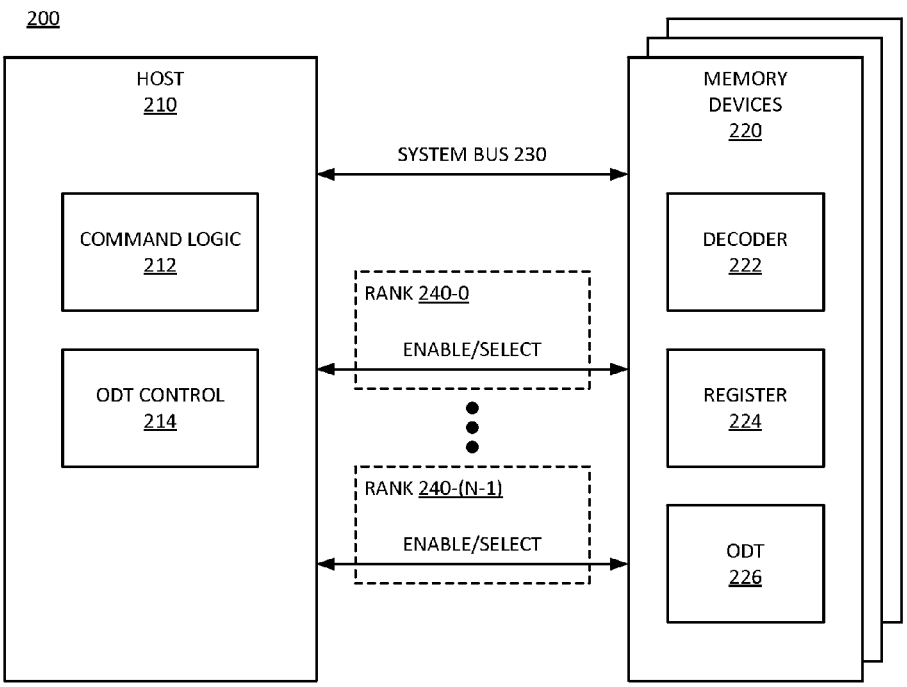
FIG. 2 is a block diagram of an embodiment of a system that applies ODT with timing control for memory devices in a memory system.

FIG. 2 is a block diagram of an embodiment of a system that applies ODT with timing control for memory devices in a memory system. System 200 illustrates portions of a memory subsystem of a computing device, and provides one example of an embodiment of system 100 of FIG. 1. Host 210 represents logic that will manage accesses to system memory. Host 210 can include a memory controller or other circuit on a processor or SoC or integrated with a processor to control memory access.

Memory devices 220 represent multiple devices that store code and/or data for a host system to execute operations. Memory devices 220 can be organized as ranks 240 to facilitate access to larger numbers of bits concurrently. A rank includes multiple memory devices in parallel. In one embodiment, ranks 240 share data pins, command/address (C/A) pins, and clock pins. Each rank 240 includes a specific one or more enable signals to select between different ranks. As illustrated, system 200 includes N ranks 240. The specific grouping of the signal lines is not necessarily physically grouped by rank. In one embodiment, certain signal lines are reused between ranks 240. In one embodiment, all memory devices 220 share the same data bus, command/address (C/A) bus, and share a clock or strobe signal (which can include one or more signal lines). System 200 can use enable signals, such as CKE (clock enable) and chip select (CS), and/or CS and other enable signals, to distinguish one rank or device grouping from another. Thus, memory devices 220 that are part of the same rank 240 can share the same enable/select signal. In an implementation involving an I/O interface between something other than a memory subsystem, rank 240 can represent some other grouping of devices by common bus.

Memory devices 220 can be spread in multiple multichip packages (MCP) or other packaging that includes multiple devices. While the devices within the packages may be spaced close enough that the risk of signal degradation due to reflections is tolerable, when there are multiple device packages, there is a high likelihood of signal degradation due to the spacing of ranks between packages. In one embodiment, memory devices 220 in a same rank 240 share ODT signaling.

Host 210 includes command logic 212 to generate commands to memory devices 220. In one embodiment, ODT control 214 represents logic to control the selective operation of ODT within memory devices 220, and can be ODT logic similar to that of system 100. ODT control 214 can configure timing settings applied by memory devices 220 for application of ODT. In one embodiment, host 210 identifies system configuration for memory devices 220, such as by querying the components for their type and/or accessing information stored in a BIOS (basic input/output system) or other system control that provides configuration information. Based on the configuration (e.g., how many devices per package, how the ranks are assigned per package) and the selected target rank (e.g., determining which package(s) the target rank is located in), ODT control 214 can determine to selectively change ODT settings for one or more memory ranks 240 in addition to the target rank. The ODT settings can include ODT value, as well as one or more programmable latency settings.

Memory devices 220 include decoder 222, which represents logic to receive and decode commands from host 210. The decoding can determine whether the command applies to the memory device. In one embodiment, memory device 220 determines based on decoder 222 what value of ODT impedance to apply, as well as what timing parameters to apply to the ODT. Memory device 220 applies the settings to ODT 226, which controls an I/O interface with host 210. In one embodiment, memory device 220 includes register 224 to set one or more configuration parameters for ODT timing. By providing one or more writeable settings in register 224, ODT timing settings can be programmable within memory device 220.

In one embodiment, all ranks 240 that receive a memory access command change an ODT setting. The number of ranks 240 that receive the memory access command can be a subset or all of the ranks in system 200. In one embodiment, sending the command to ranks 240 will trigger one or more ranks to change an ODT setting for the memory transaction. Memory devices 220 can be configured to change the ODT setting for a period of time equal to an expected duration of a memory access transaction. A memory transaction can refer to a full number of cycles used to exchange data for a Read or Write memory access operation. For example, a Read transaction can last long enough for each memory device to access and provide one or more bits of information over one or more execution cycles (clock cycles) to the memory controller, with a nominal duration of tCL. Similarly, a Write transaction can last long enough for the memory controller to transfer all data bits into the receive buffers of the selected target memory devices, with a nominal duration of tWL. A transaction can be a burst length (a number of cycles used to transfer data associated with a memory access command over the data bus).

In one embodiment, ODT control 214 can configure ODT 226 with timing settings based on I/O training between memory devices 220 and host 210. For example, in one embodiment, during a boot phase, host 210 can perform testing of I/O with memory devices 220 to determine what settings provide highest signal quality. The testing can include the testing of different turn on and turn off times by memory devices 220 of ODT 226. Based on analysis of the testing, host 210 can program a setting for one or more of the following for each memory device 220. In one embodiment, host 210 programs a Read ODT turn on time or latency parameter. In one embodiment, host 210 programs a Read ODT turn off time or latency parameter. In one embodiment, host 210 programs a Write ODT turn on time or latency parameter. In one embodiment, host 210 programs a Write ODT turn off time or latency parameter. In one embodiment, host 210 programs one or more parameters via a Mode Register Set (MRS) command to set one or more mode register settings.

Figure 3A:
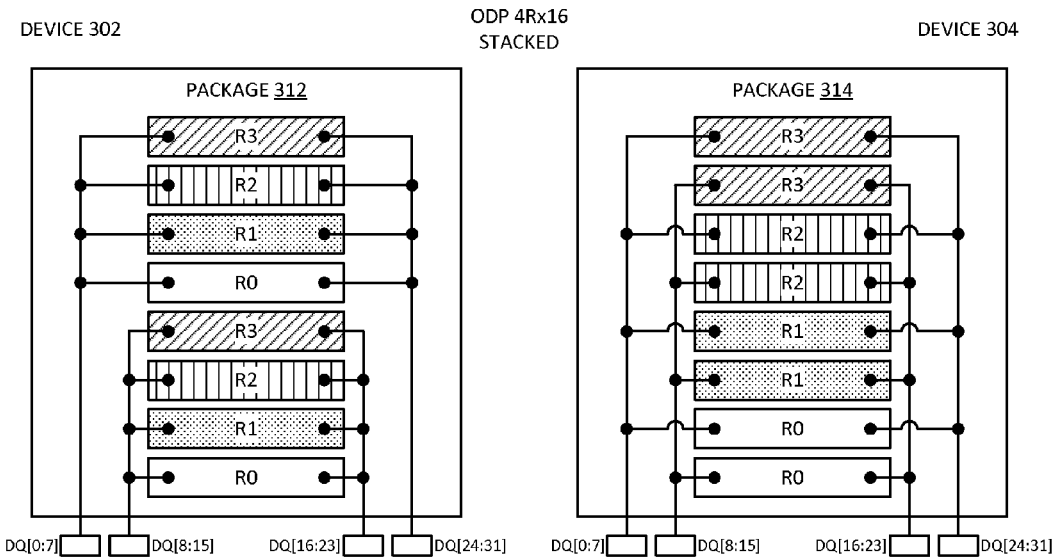
FIG. 3A is a block diagram of embodiments of known octo-die packaging.

FIG. 3A is a block diagram of embodiments of known octo-die packaging. Devices 302 and 304 both represent know examples of four rank systems using x16 devices. It will be understood that x16 refers to a device that with a 16-bit wide data I/O bus. Thus a x8 device has an 8-bit wide data I/O bus, a x32 device has a 32-bit wide data I/O bus, and so forth. Package 312 that is part of device 302, and package 314 that is part of device 304 include memory devices in an octo-die package (ODP). Devices 302 and 304 can be memory modules and/or components that are processed onto a host system substrate or board.

As illustrated, package 312 includes eight die or memory devices stacked on each other, and is organized as four ranks (R0 . . . R3). Device 302 organizes the memory devices from the device closest to the signal lines to the device farthest from the signal lines as: R0, R1, R2, R3, R0, R1, R2, and R3. As the devices are x16, they should each be connected to 16 DQ signal lines. Device 302 is configured with the lower four devices connecting to DQ[8:23], and the upper four devices connecting to DQ[0:7] and DQ[24:31]. Device 304 organizes the memory devices from the device closest to the signal lines to the device farthest from the signal lines as: R0, R0, R1, R1, R2, R2, R3, and R3. Device 304 is configured with the zeroeth, second, fourth, and sixth devices connecting to DQ[8:23], and the first, third, fifth, and seventh devices connecting to DQ[0:7] and DQ[24:31].

The ODP illustrates a known approach to packaging that preserves the assumptions of proximity that allows not applying ODT on multiple ranks. Because the devices share a package, the distances of the signal lines to each memory device eliminate the need for termination by any device other than the target or selected device for Write. Thus, only the target device or target rank needs to provide termination on Write. It will be understood that package 312 will be part of device 302, which will include multiple packages similar to package 312. The same is true of package 314 of device 304. Thus, the ranks as illustrated will include similarly positioned device in other packages of the device. While packages 312 and 314 can eliminate the need for termination, current processing techniques result in very low yields for eight-high stacks such as those shown. The low yields increases the cost and reduces the adoption of the packaging.

Figure 3B:
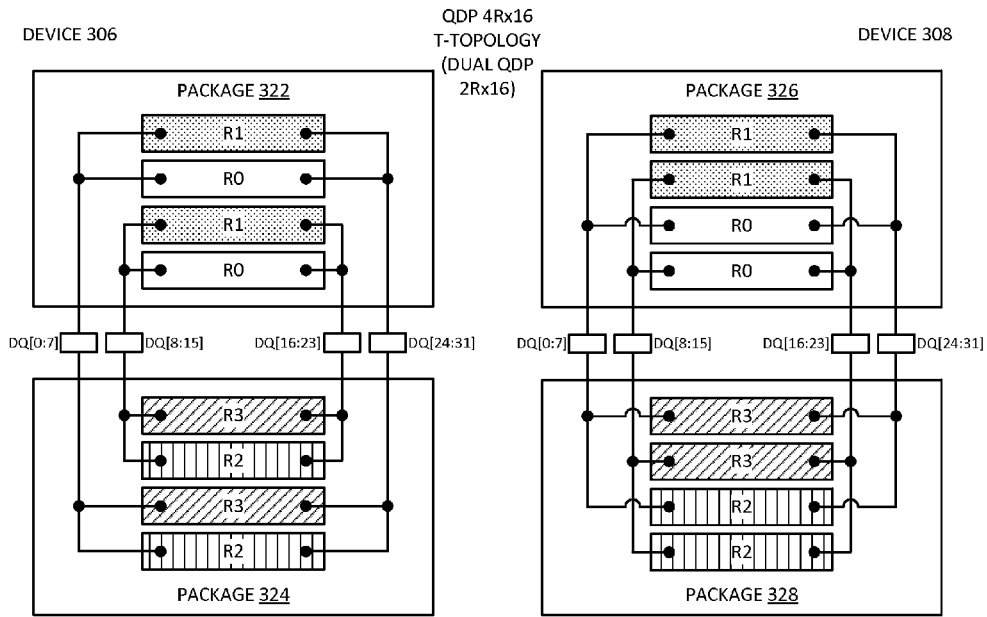
FIG. 3B is a block diagram of embodiments of memory devices mounted in quad-die packages where the system provides selective on-die termination control.

FIG. 3B is a block diagram of embodiments of memory devices mounted in quad-die packages where the system provides selective on-die termination control. In one embodiment, memory devices can be in multi-device packages, which typically include memory devices of different ranks in the same package. Similar to what is illustrated in FIG. 3A, instead of having a single die with a 64 bit wide interface (or greater), or even a 32 bit wide interface, a memory subsystem can be made from x16 devices as illustrated, or x8 devices. In one embodiment, a memory architecture uses two separate packages of four devices or dies each to provide a four-rank x16 memory. Device 306 and device 308 represent devices that incorporate such memory architecture. Devices 306 and 308 can be memory modules, or can be host system boards themselves. Devices 306 and 308 illustrate a 'T' topology on the data bus, where signal lines connectors branch out into two separate packages from the signal line connectors. The memory controller associated with the ranks of memory can selectively enable ODT to selectively provide termination on both branches of the 'T' to minimize reflection on Write. Thus, the system can provide termination in a device other than (or in addition to) the selected or target device, on a per transaction basis. In one embodiment, the system does not have to provide termination on all devices, but can select a subset of the devices to apply ODT on Write.

In one embodiment, device 306 includes packages 322 and 324, each including four devices organized as two ranks of the four ranks total. Specifically, package 322 includes ranks R0 and R1, and package 324 includes ranks R2 and R3. Package 322 as illustrated includes memory devices organized from the device closest to the signal lines to the device farthest from the signal lines as: R0, R1, R0, and R1. Package 322 is configured with the closer R0 and R1 devices connecting to DQ[8:23], and the farther R0 and R1 devices connecting to DQ[0:7] and DQ[24:31]. Package 324 as illustrated includes memory devices organized from the device closest to the signal lines to the device farthest from the signal lines as: R3, R2, R3, and R2. Package 322 is configured with the closer R3 and R2 devices connecting to DQ[8:23], and the farther R3 and R2 devices connecting to DQ[0:7] and DQ[24:31].

In one embodiment, device 308 includes packages 326 and 328, each including four devices organized as two ranks of the four ranks total. Specifically, package 326 includes ranks R0 and R1, and package 328 includes ranks R2 and R3. Package 326 as illustrated includes memory devices organized from the device closest to the signal lines to the device farthest from the signal lines as: R0, R0, R1, and R1. Package 326 is configured with the closer R0 and R1 devices connecting to DQ[8:23], and the farther R0 and R1 devices connecting to DQ[0:7] and DQ[24:31]. Package 328 as illustrated includes memory devices organized from the device closest to the signal lines to the device farthest from the signal lines as: R3, R3, R2, and R2. Package 328 is configured with the farther R3 and R2 devices connecting to DQ[8:23], and the closer R3 and R2 devices connecting to DQ[0:7] and DQ[24:31].

It will be understood that in either the case of devices 306 or 308, other configurations of the memory devices, the rank organization, and the connections to the signal lines can be modified. Thus, the examples are illustrative, and are not limiting. Both devices 306 and 308 employ quad-die package (QDP) technology, which generally provides much better yields than ODP. While splitting the eight memory device chips into two separate packages prevents turning ODT off completely, the system can apply ODT selectively.

Consider an example of selective application of ODT in device 306. Consider a Write command to write to rank R1. In one embodiment, R1 will terminate the signal because it is the target rank, and will absorb the signal energy entering package 322. In one embodiment, the system can also trigger rank R3 and/or rank R2 to engage ODT to absorb the signal energy in package 324 to preserve signal quality by reducing reflections. The different devices triggered to apply ODT can keep ODT engaged for a period of a memory access transaction.

In one embodiment, even with the balanced routing of the T-topology of devices 306 and 308, operating conditions can result in load imbalance among ranks, which can result in impedance mismatches for the ODT. In one embodiment, an associated memory controller (not specifically shown) will configure one or more ODT timing or latency settings for the memory devices, in accordance with any embodiment described herein. Thus, in addition to selectively applying termination based on commands received, the memory devices can apply different ODT latencies based on configuration. Even without external ODT pins for control signals between the memory device and a memory controller, the memory devices can provide ODT termination with programmable ODT turn ON and OFF timings. In one embodiment, each memory device stores an offset to apply to default Write latency, Read latency, Write preamble or postable, and/or Read preamble or postamble values.

Figure 3C:
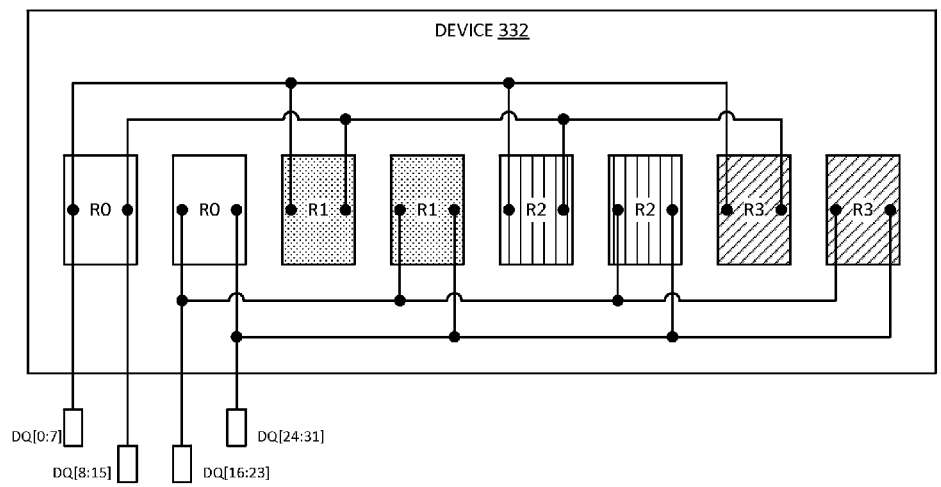
FIG. 3C is a block diagram of an embodiment of a memory system having a daisy chain topology where the system provides selective on-die termination control.

FIG. 3C is a block diagram of an embodiment of a memory system having a daisy chain topology where the system provides selective on-die termination control. It will be understood that with programmable ODT timing parameters, the topology of the ranks is not limited to T-branches. For example, consider a representation of a daisy-chain topology (which is illustrative only, and not necessarily a production layout). Other configurations are possible.

The system designer can provide different memory layouts based on the system in which the memory will be included. The different layouts are enabled by the programmability of different Read ODT and Write ODT timings. Thus, timing for ODT can be defined generically as a default, with adjustment possible by a number of clock cycles in either direction based on what timing will turn ODT on and off for each memory device in a way to improve signal quality within device 332. Thus, each rank R[3:0] can be configured differently for read and write timing settings. The timing settings can be different depending on when the rank is the target rank or the non-target rank. For example, the target rank may follow a default value, which can be adjusted when it is a non-target rank.

FIG. 4A is a representation of an embodiment of command encoding for controlling on-die termination for memory access. Command table 400 can more specifically be an example of an embodiment of commands for use in an LPDDR4 system, and can apply to an embodiment of a memory subsystem described herein that supports ODT timing control. A memory controller generates the commands listed to generate the desired operation. LPDDR4 uses multi-cycle commands. For example, a Write command consists of two cycles of WRITE-1 followed by two cycles of CAS-2 (refer to table 400). The SoC or memory controller or equivalent (generically "memory controller") sends each cycle consecutively or sequentially without gaps.

In one embodiment, the memory controller broadcasts or multicasts a WRITE-1 command to multiple ranks. The memory controller can assert a Chip Select (CS) signal or other enable signal when sending the Write command to ensure that the desired ranks receive the command. The command is not necessarily sent to every rank or every DRAM device, but it can be. In one embodiment, the memory controller sends the command to at least one rank per package. In one embodiment, DRAM devices receiving a WRITE-1 command are configured to automatically turn on ODT. The DRAMs can keep ODT engaged on for the duration of the Write transaction, which includes all cycles of all commands used to implement the operation. In one embodiment, the memory controller only sends CAS-2 to the rank receiving the data. Thus, DRAMs may receive a WRITE-1 command and engage ODT, but not receive a subsequent CAS-2 command. Thus, the DRAM will not execute the command, but can still be configured to maintain ODT engaged.

A similar approach can be applied for Read transactions. For example, the memory controller can broadcast or multicast a READ-1 command to two or more ranks. The memory controller can then send a CAS-2 command addressed only to the target rank, with the other, non-target ranks not receiving the CAS-2 command. The memory controller can select the target rank and one or more other ranks to disengage ODT for the Read transaction.

Thus, the memory controller causes the target rank to execute the command or memory access operation (e.g., Read or Write), while one or more other ranks selectively apply ODT by changing an ODT setting for the duration of the memory access transaction or operation. In one embodiment, the duration of the memory access transaction can also cover the programmed preamble and postamble values for the memory access type (e.g., Read or Write).

In one embodiment, the memory subsystem defaults to all ranks applying ODT for Write. A memory subsystem may default to all ranks applying ODT, for example, when terminating to Vss. Thus, if the bus is in tristate or Vss, there will be no power consumption. Rtt_park refers to a high valued resistor connected to the termination, which can eliminate the need to activate ODT except for the target rank. The target rank can use a lower value resistance (e.g., Rtt_wr). While such an implementation would not require selectively controlling ODT at non-target ranks, the high value resistance can reduce signal integrity and increase power consumption. In one embodiment, the memory devices support different value of ODT. In one embodiment, the system can select one rank on each branch of the T and use a higher value of resistance for ODT (such as the value that would be used for Rtt_park). In one embodiment, the system can use the same Rtt_park value for Reads and Writes on the non-target rank(s). However, for Read commands to a non-target rank, setting ODT to the Rtt_park value can result in a non-optimal solution. Thus, the memory controller can send a READ-1 broadcast command to cause the memory devices to change Rtt_park to Rtt_nom on the non-target rank(s). In one embodiment, the memory controller can send a READ-1 command to selectively enable ODT as needed on the non-target rank(s).

Consider a specific example of a Write command in LPDDR4 in accordance with Table 400. In LPDDR4, the system uses two commands that each use two cycles for a write or read operation. Thus, a write operation takes four cycles by sending two cycles of WRITE-1 command followed sequentially by two cycles of CAS-2. In one embodiment, when a memory device sees a write command (WRITE-1) (or when it receives a command for which it is selected), it enables ODT. The memory controller can enable ODT on multiple ranks by triggering a CS signal (CS=H on cycle 1 of WRITE-1) on the command. In one embodiment, the device will engage or enable ODT for a burst length, and then turn off ODT.

Thus, the system can send a WRITE-1 on the shared C/A bus and send a CS to multiple ranks concurrently. The devices that receive the WRITE-1 command with the CS can activate or engage ODT. The system then sends CAS-2 to a selected or target rank. If a rank received a CS on the WRITE-1 command (CS=H on the first cycle of WRITE-1), but does not receive a CAS-2 CS signal (CS=L on the first cycle of CAS-2), then the memory device leaves ODT activated, but does not execute the command or operation. In one embodiment, only the memory device selected with a CS=H on the second cycle of the CAS-2 command executes the memory access operation. Thus, in one embodiment, ranks that are not selected for ODT receive a CS L-L for WRITE-1, and a CS L-L for CAS-2. Ranks that are selected for ODT, but that are not the target rank receive a CS H-L for WRITE-1, and a CS L-L for CAS-2. The target rank receives a CS H-L for WRITE-1, and CS H-L for CAS-2. The memory controller can selectively generate all of these signals to selectively trigger the desired ODT. In one embodiment, the memory controller activates ODT for at least one rank per package.

It will be understood that the system can similarly selectively enable ODT for Read operations. For example, the memory controller could selectively enable a CS signal for READ-1 and CAS-2 commands to trigger ODT enabling by certain ranks (e.g., one or more non-target ranks), as well as identifying the target rank to execute the Read command. In one embodiment, a memory device initially does not have ODT engaged. In one embodiment, a memory device that receives a READ-1 command will determine based on the CAS-2 command whether to engage ODT. For example, in one embodiment, the memory device expects to receive a CAS-2 command to follow immediately after a READ-1 command. Thus, if the memory device receives a READ-1 command with a select signal set to true followed by a CAS-2 command with the select signal set to false, the memory device can engage ODT. A memory device that receives the READ-1 command with the select signal set to true followed by a CAS-2 command with the select signal set to true will disengage ODT or leave ODT disengaged and execute the command. In one embodiment, with a Write operation, a rank that receives a WRITE-1 with a select signal set to true followed by a CAS-2 with the select signal set to false will engage ODT and leave it engaged while not executing the command. A rank that receives a WRITE-1 with the select signal set to true followed by a CAS-2 with the select signal set to true will engage ODT and execute the command. Thus, in one embodiment, for a Read, the lack of CAS-2 command can trigger the rank to engage ODT, while for a Write the receiving the WRITE-1 command can trigger the rank to engage ODT. The registration of a memory device (i.e., the rank the memory device belongs to receives a CS signal along with the command sent on the C/A bus) or lack of registration can be used to determine what state of ODT the memory device should apply.

FIG. 4B is a representation of an embodiment of a table for controlling on-die termination value for memory access. Register 410 represents a register or storage area local such as a mode register for a memory device that can be used to program a desired ODT value for Writes on a given rank. In one embodiment, register 410 can indicate a value of impedance for the termination for each device. Register 410 shows different values based on the settings of OP[0:2]. Based on the settings of OP[2:0], ODT can be disabled [000], have an intrinsic value [001], or be divided by some multiple (divided by 2, 3, 4, 5, or 6 for [010] to [110], respectively). In one embodiment, various different termination resistance values can be selected by setting register 410.

In one embodiment, an Rtt_park value can be approximately 240 Ohms, and an Rtt_nom value can be approximately 40 Ohms (which can correspond to different values in register 410, depending on the intrinsic value of RZQ). The Rtt_nom can be set to provide termination to the signal based on expected impedance matching. The value of Rtt_park can be set low enough to suppress most noise (and is therefore not considered a high impedance state), but will not terminate as well as the Rtt_nom value. The benefit of setting Rtt_park higher than Rtt_nom is that the higher value will draw less current. It will be understood that different ranks and/or DRAMs can be set to different resistance values based on the command received, or whether or not a command is received.

FIG. 4C is a representation of an embodiment of memory access command encoding for controlling on-die termination timing for memory access. Command table 420 illustrates one embodiment WRITE-1 and READ-1 commands in accordance with command table 400 of FIG. 4A. There is a difference highlighted between corresponding commands in command table 400 and command table 420. More specifically, whereas CA3 on the second clock edge of both WRITE-1 and READ-1 in command table 400 has a value of 'V' or "Don't Care," CA3 on the second clock edge in command table 420 can indicate a type of access command. The different types of commands can signal for the memory device to use a different timing or offset for ODT.

For example, WRITE-1 can be separately interpreted as WRITE-1A and WRITE-1B, depending on the logic value of CA3 (where H selects one write type and L selects the other). Similarly, READ-1 can be separately interpreted as READ-1A and READ-1B, depending on the logic value of CA3 (where H selects one write type and L selects the other). Thus, the logic value of CA3 can be an identifier or an indication in the command encoding about how to engage ODT, such as an ODT timing type. In one embodiment, for a non-target rank, WRITE-1A can indicate to use offset A for ODT timing, and WRITE-1B can indicate to use offset B for ODT timing. Similarly, READ-1A can indicate to use offset A for ODT timing, and READ-1B can indicate to use offset B for ODT timing. Thus, when a non-target rank receives an access command without an accompanying CAS-2 command, the memory devices can apply the indicated type of ODT timing depending on whether a 1A or 1B command was sent.

FIG. 4D is a representation of an embodiment of a table for controlling on-die termination timing for memory access. In one embodiment, the value of Read ODT can be defined to be same as ODT for Write, which can be a value stored in a register (e.g., Mode Register 11). If the stored value is not optimal, in one embodiment, another register can be defined to program a Read ODT value for non-target ranks. The use of the same value works well with T-topologies with balanced loading, as discussed above. If the topology is daisy chained or other non-T topology, or the loading is unbalanced, then a different value will be more optimal. The duration of ODT turn on time in a non-target rank can also be set to a different sized window than the target rank. In one embodiment, the system supports a programmable offset based on WL for Writes and a programmable offset based on CL for Reads. In one embodiment, the offset covers at least a few (e.g., 2, 4, 8, or other number) additional cycles in both the negative and positive direction with respect to the latency period (e.g., WL or CL).

Register 430 represents one embodiment of a register that can store one or more values indicating ODT timing. In one embodiment, register 430 is accessed by identifying an address (e.g., 432, 434, 436, and 438) that indicates an entry in the register or a register to access for a timing value. In one embodiment, entry 432 identifies a Write ODT ON timing, with a value of offset 442. Offset 442 can more specifically identify a number of clock cycles prior to WL to enable ODT. In one embodiment, entry 434 identifies a Write ODT OFF timing, with a value of offset 444. Offset 444 can more specifically identify a number of clock cycles after WL to disable ODT. In one embodiment, entry 436 identifies a Read ODT ON timing, with a value of offset 446. Offset 446 can more specifically identify a number of clock cycles prior to CL to enable ODT. In one embodiment, entry 438 identifies a Read ODT OFF timing, with a value of offset 448. Offset 448 can more specifically identify a number of clock cycles after CL to disable ODT.

In one embodiment, four mode registers or mode register settings can be defined (where each entry 432, 434, 436, and 438 represents the different mode registers or mode register settings) for offset with a range of values. In one embodiment, the value of offsets 442, 444, 446, and 448 can be from 1 tCK to N tCK, where N can be for example, 8, 12, 16, or some other number. In one embodiment, ODT OFF timing can be applied as an extra offset in addition to WL/CL+BL (burst length). Programmable ODT settings can enable a rank (e.g., a non-target rank) to control the turn on and/or turn off timing of ODT, to prevent ODT from being applied when it is not needed. Thus, programmable ODT timing can provide for ODT only as needed. For example, memory devices can apply ODT for just enough time to reduce signal reflections, and turn ODT on and/or off with enough precision to otherwise not use the power needed to apply ODT.

In one embodiment, register 430 includes two or more termination offsets, depending on the type of ODT timing to apply, as indicated by command encoding. For example, register 430 can include A and B entries for each ODT timing type (Write ON A and Write ON B, Write OFF A, Write OFF B, and so forth). Such selection of ODT timing type can be in accordance with command table 420 of FIG. 4C.

Figures 5A, 5B:
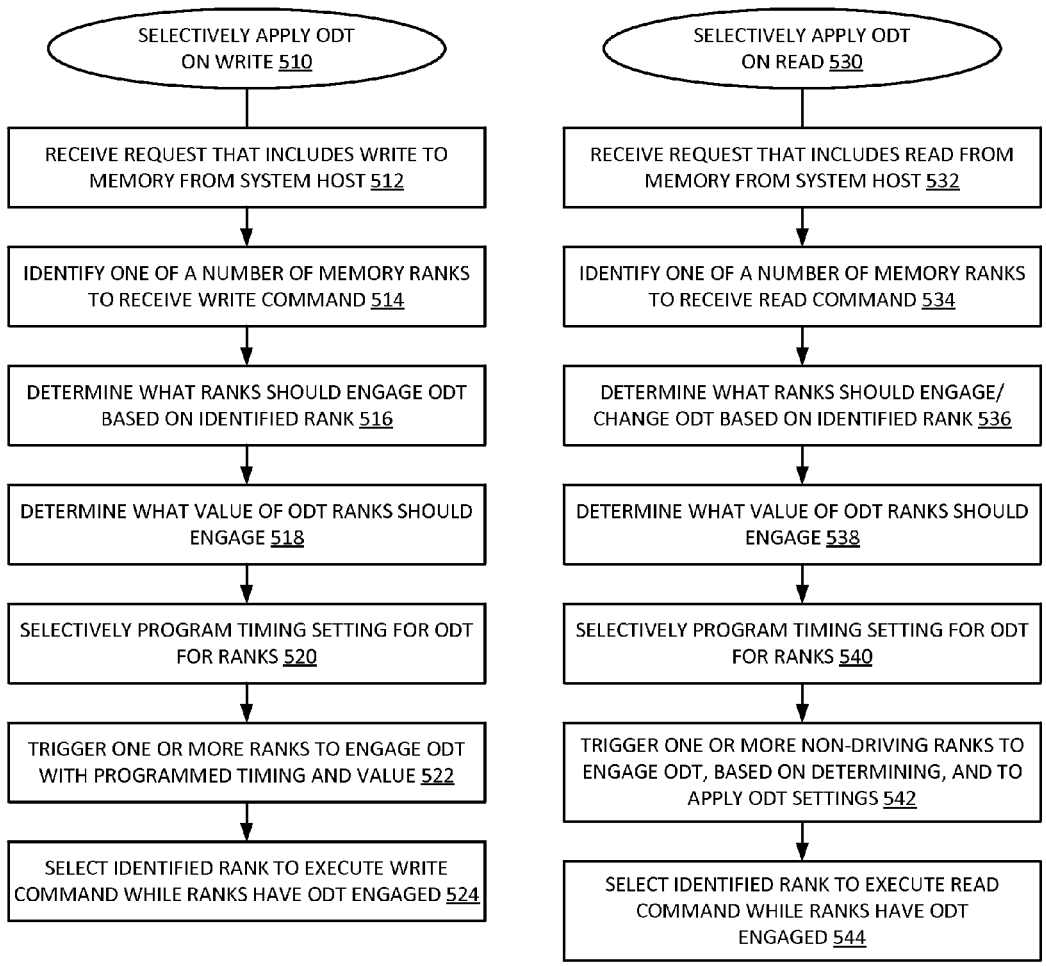
FIG. 5A is a flow diagram of an embodiment of a process for selectively applying on-die termination for a Write operation.
FIG. 5B is a flow diagram of an embodiment of a process for selectively applying on-die termination for a Read operation.

FIG. 5A is a flow diagram of an embodiment of a process for selectively applying on-die termination for a Write operation. A memory subsystem can include multiple memory devices or DRAMs that store data, and a memory controller that provides memory access commands to the memory devices. The memory devices are organized as ranks of memory, with multiple devices that respond together to a memory access command forming a rank. In one embodiment, the ranks are separated in ways that affects the symmetry of the terminations, such as with different multi-device packages, unbalanced loading, non-symmetrical topologies, or other symmetry mismatches.

The operations of process 510 occur in the memory subsystem. In one embodiment, the memory controller receives a request from a host system processor that includes an operation to write to memory, 512. In one embodiment, the memory controller identifies one of the number of memory ranks in the system as a target rank for the write command, 514. The memory controller will identify the target memory rank based on how data is mapped to the memory arrays of the memory devices.

In one embodiment, the memory controller determines what ranks should engage ODT based on the rank identified as the target rank, 516. For example, the memory controller can follow a guide or rule to ensure that at least one rank per memory device package engages ODT for a write operation. In one embodiment, the memory controller further determines what value of ODT should be applied by each rank, 518. In certain implementations, a non-target memory device can provide sufficient termination by applying a value of ODT that is different than the value applied by the target rank. For example, in one embodiment, a memory device that is part of the target rank can drive Rtt_wr, and if it is not part of the target rank it can drive Rtt_nom (a nominal value of resistance).

In one embodiment, the memory controller determines what value of ODT timing a rank should apply, and selectively programs the timing setting for ODT for the ranks, 520. The programming of ODT timing can be in accordance with any embodiment of programmable ODT timing described herein. In one embodiment, the timing setting is based on what type of transaction as well as whether the rank is a target rank or non-target rank. In one embodiment, the value of the timing settings is based on training that determines higher signal integrity for the Write transaction.

The memory controller triggers multiple ranks to engage ODT, based on determining which ranks should engage ODT, 522. As described above, the memory controller can trigger a memory device to engage ODT by an enable or chip select signal. In one embodiment, the memory controller could issue a separate command to cause the memory device to engage ODT. The target rank will execute the write command while all ranks selected to engage ODT have ODT engaged, 524. The ranks will selectively engage ODT for the Write transaction in accordance with programmable timing parameters. Different timing parameters can be used for Write and Read transactions.

FIG. 5B is a flow diagram of an embodiment of a process for selectively applying on-die termination for a Read operation. A memory subsystem can include multiple memory devices or DRAMs that store data, and a memory controller that provides memory access commands to the memory devices. The memory devices are organized as ranks of memory, with multiple devices that respond together to a memory access command forming a rank. In one embodiment, the ranks are separated in ways that affects the symmetry of the terminations, such as with different multi-device packages, unbalanced loading, non-symmetrical topologies, or other symmetry mismatches.

The operations of process 530 occur in the memory subsystem. In one embodiment, the memory controller receives a request from a host system processor that includes an operation to read from memory, 532. In one embodiment, the memory controller identifies one of the number of memory ranks in the system as a target rank for the read command, 534. The memory controller will identify the target memory rank based on how data is mapped to the memory arrays of the memory devices. In one embodiment, the memory controller determines what ranks should engage ODT and/or change an ODT setting based on the rank identified as the target rank, 536. In one embodiment, the memory controller further determines what value of ODT should be applied by each rank that will apply ODT, 538.

In one embodiment, the memory controller determines what value of ODT timing a rank should apply, and selectively programs the timing setting for ODT for the ranks, 540. The programming of ODT timing can be in accordance with any embodiment of programmable ODT timing described herein. In one embodiment, the timing setting is based on what type of transaction as well as whether the rank is a target rank or non-target rank. In one embodiment, the value of the timing settings is based on training that determines higher signal integrity for the Read transaction.

In one embodiment, the memory controller triggers one or more non-driving or non-target ranks to engage and/or change ODT, based on the determination made, 542. Thus, the memory controller can select one or more ranks to engage termination to reduce reflections while the target rank sends data to the memory controller. As described above, the memory controller can selectively trigger specific memory devices to engage ODT or change an ODT setting by use of an enable or chip select signal. In one embodiment, the memory controller could issue a separate command to cause the memory device to engage ODT. The target rank will execute the read command while any selected to engage ODT has ODT engaged, 544. The ranks will selectively engage ODT for the Read transaction in accordance with programmable timing parameters. Different timing parameters can be used for Write and Read transactions.

Figure 5C:
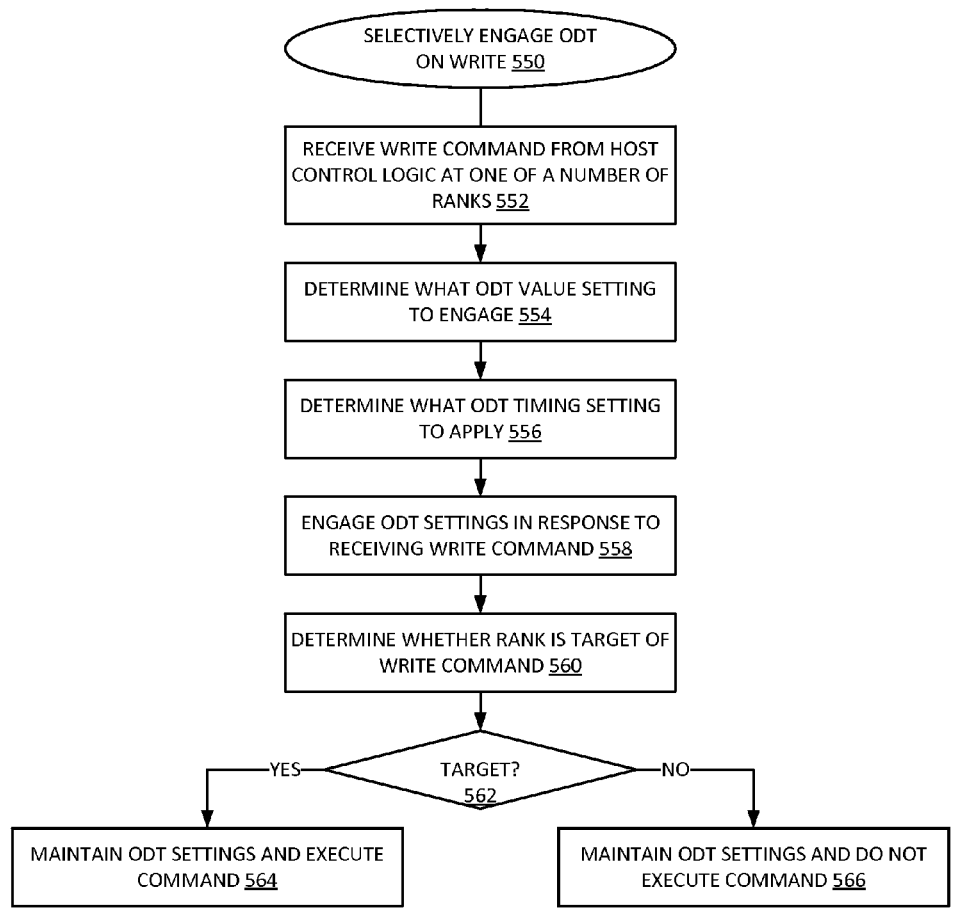
FIG. 5C is a flow diagram of an embodiment of a process for selectively engaging on-die termination for a Write operation.

FIG. 5C is a flow diagram of an embodiment of a process for selectively engaging on-die termination for a Write operation. A memory subsystem can include multiple memory devices or DRAMs that store data, and a memory controller that provides memory access commands to the memory devices. The memory devices are organized as ranks of memory, with multiple devices that respond together to a memory access command forming a rank. In one embodiment, the ranks are separated in ways that affects the symmetry of the terminations, such as with different multi-device packages, unbalanced loading, non-symmetrical topologies, or other symmetry mismatches.

The operations of process 550 occur in the memory subsystem. In one embodiment, a memory device that is one of multiple memory devices in one of multiple ranks in the memory subsystem receives a write command from the memory controller, 552. Many discussions above refer to a "memory rank" performing an operation. Such an expression will be understood as shorthand to refer to the fact that each memory device within the rank performs the operation to respond to the command. As discussed above, in one embodiment, a memory device receives a memory access command when the memory controller selects the device to receive the command. In one embodiment, the memory device performs a change to an ODT setting in response to receiving a command, based on decoding what type of command is received.

Thus, the memory device decodes the incoming memory access command and determines that it is a write command, and that it is selected to receive the command. In response to the decoding, the memory device can determine what value of ODT to engage, 554. In one embodiment, the memory device accesses a mode register (MR) for the memory device to determine what value of ODT is selected in the MR settings.

In one embodiment, the memory device determines what value of ODT timing to apply, 556. The application of ODT timing can be in accordance with any embodiment of programmable ODT timing described herein. In one embodiment, the timing setting is based on what type of transaction as well as whether the rank is a target rank or non-target rank. In one embodiment, the value of the timing settings is based on training that determines higher signal integrity for the Write transaction. In one embodiment, the ODT timing is based on one or more timing parameters stored in one or more registers, and can be set by the memory controller.

In one embodiment, the memory device engages ODT in response to receiving the write command, in accordance with the ODT value indicated, 558. In one embodiment, a memory device that is part of the target rank can drive Rtt_wr, and if it is not part of the target rank it can drive Rtt_nom. Thus, not all ranks that apply ODT will drive the same amount of resistance.

In one embodiment, the memory device determines whether it is part of the target rank for the write command, 560. In one embodiment, the memory device makes the determination based on whether it is selected in a subsequent memory access command (e.g., in a CAS-2 command as described above). In one embodiment, the memory device can receive another command from the memory controller indicating the target rank. If the memory device is part of the target rank, 562 YES branch, the memory device maintains ODT engaged and executes the command, 564. If the memory device is not part of the target rank, 562 NO branch, the memory device maintains ODT engaged, but does not execute the command, 566. The memory device will selectively engage ODT for the Write transaction in accordance with programmable timing parameters. Different timing parameters can be used for Write and Read transactions.

Figure 5D:
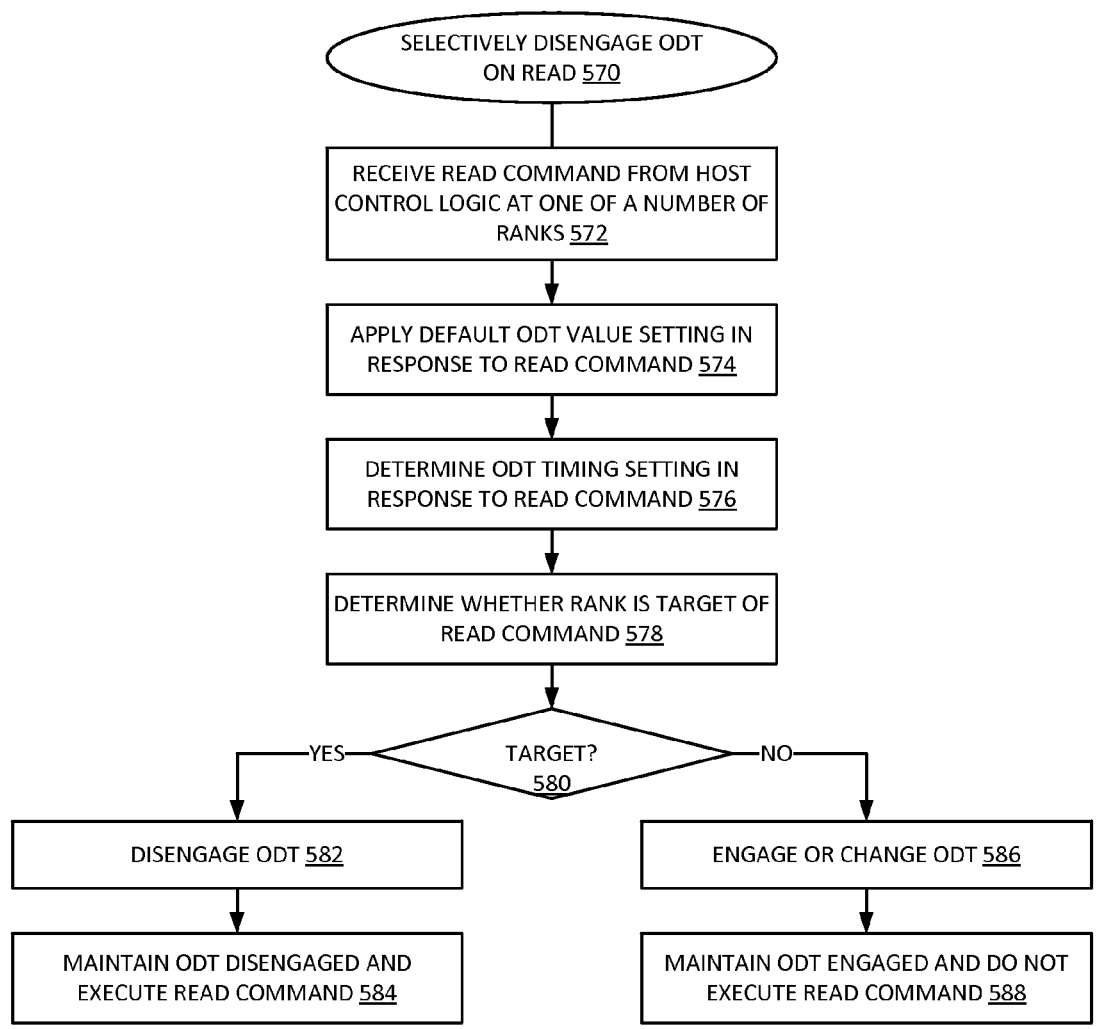
FIG. 5D is a flow diagram of an embodiment of a process for selectively engaging on-die termination for a Read operation.

FIG. 5D is a flow diagram of an embodiment of a process for selectively engaging on-die termination for a Read operation. A memory subsystem can include multiple memory devices or DRAMs that store data, and a memory controller that provides memory access commands to the memory devices. The memory devices are organized as ranks of memory, with multiple devices that respond together to a memory access command forming a rank. In one embodiment, the ranks are separated in ways that affects the symmetry of the terminations, such as with different multi-device packages, unbalanced loading, non-symmetrical topologies, or other symmetry mismatches.

The operations of process 570 occur in the memory subsystem. In one embodiment, a memory device that is one of multiple memory devices in one of multiple ranks in the memory subsystem receives a read command from the memory controller, 572. As discussed above, in one embodiment, a memory device receives a memory access command when the memory controller selects the device to receive the command. In one embodiment, the memory device decodes the incoming memory access command and determines that it is a read command, and that it is selected to receive the command. In response to the receiving the read command and decoding the command, the memory device can apply a default ODT setting, 574. In one embodiment, the default setting is to disable ODT for the Read transaction. In one embodiment, the memory device has ODT disengaged when receiving a Read command, and engages ODT if it is not registered or selected in a CAS-2 command received directly subsequent to the Read command.

In one embodiment, the memory device determines what value of ODT timing to apply, 576. The application of ODT timing can be in accordance with any embodiment of programmable ODT timing described herein. In one embodiment, the timing setting is based on what type of transaction as well as whether the rank is a target rank or non-target rank. In one embodiment, the value of the timing settings is based on training that determines higher signal integrity for the Read transaction. In one embodiment, the ODT timing is based on one or more timing parameters stored in one or more registers, and can be set by the memory controller.

In one embodiment, the memory device determines whether it is part of the target rank for the read command, 578. In one embodiment, the memory device makes the determination based on whether it is selected in a subsequent memory access command (e.g., in a CAS-2 command as described above). In one embodiment, the memory device can receive another command from the memory controller indicating the target rank. If the memory device is part of the target rank, 580 YES branch, the memory device disables ODT, 582, and maintains ODT disengaged and executes the read command, 584. If the memory device is not part of the target rank, 580 NO branch, the memory device determines whether to engage ODT or change an ODT setting, 586. In one embodiment, other ranks in the memory subsystem will not be selected and thus not receive the Read command. Such ranks will maintain a default ODT setting, such as disabled. In one embodiment, a rank that is selected to receive the Read command, but is not the target rank will engage ODT or increase an ODT value if the default value is some value of resistance. The non-target rank maintains the ODT engaged for the Read transaction but does not execute the read command, 588. The memory device will selectively engage ODT for the Read transaction in accordance with programmable timing parameters. Different timing parameters can be used for Write and Read transactions.

Figure 6:
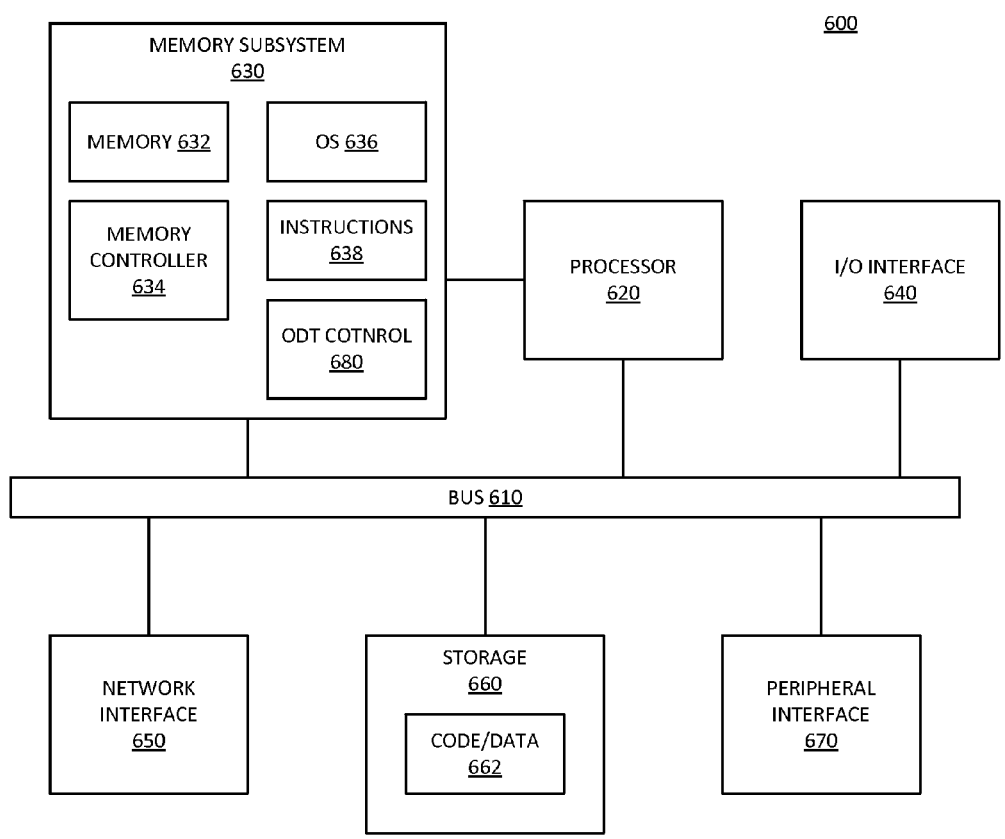
FIG. 6 is a block diagram of an embodiment of a computing system in which on-die termination control can be implemented.

FIG. 6 is a block diagram of an embodiment of a computing system in which on-die termination control can be implemented. System 600 represents a computing device in accordance with any embodiment described herein, and can be a laptop computer, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

In one embodiment, memory subsystem 630 is a multi-rank memory system. In one embodiment, system 600 includes ODT control 680, which enables the system to selectively control the activation of ODT at the different ranks in accordance with any embodiment described herein. Selective application of ODT can include ODT value and ODT timing settings specific to each rank for a command type and whether or not the rank is the target rank. ODT control 680 can perform ODT timing control in accordance with any embodiment of ODT timing discussed herein.

Figure 7:
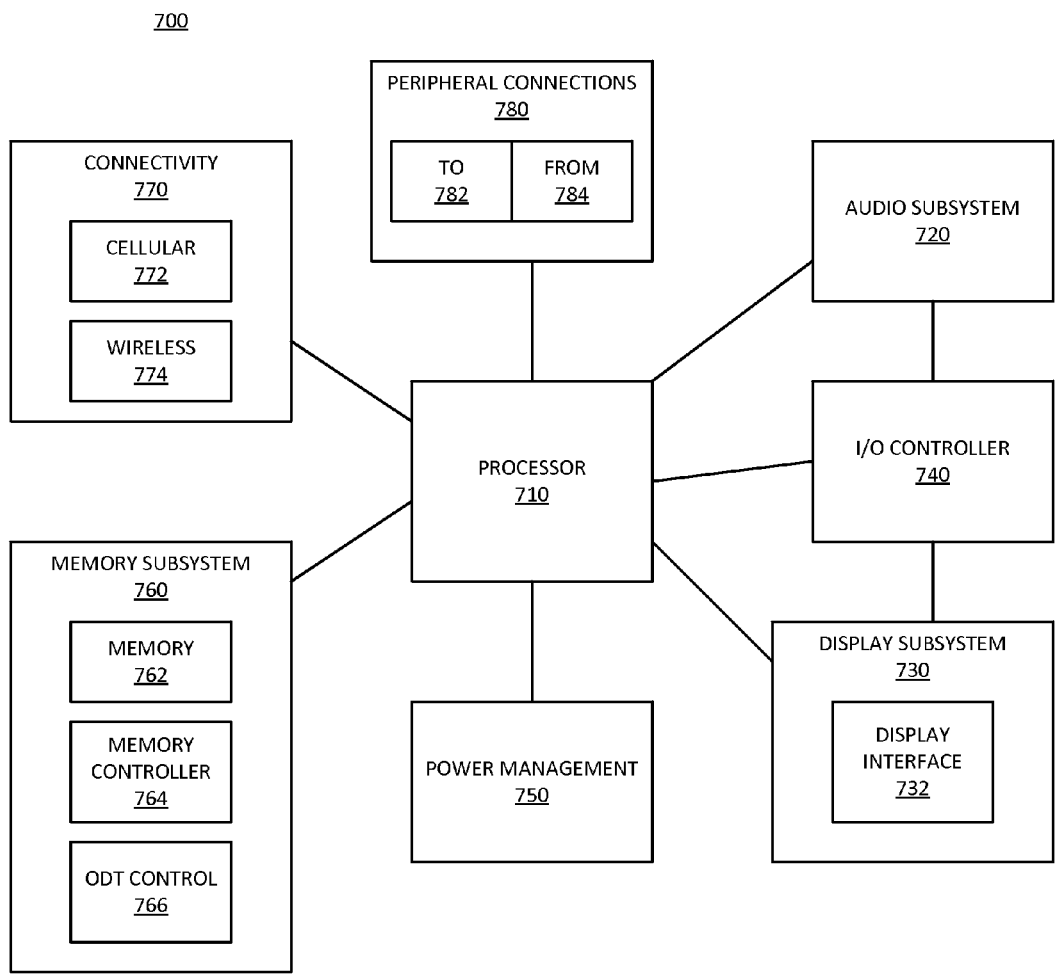
FIG. 7 is a block diagram of an embodiment of a mobile device in which on-die termination control can be implemented.

FIG. 7 is a block diagram of an embodiment of a mobile device in which on-die termination control can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 760 is a multi-rank memory system. In one embodiment, system 700 includes ODT control 766, which enables the system to selectively control the activation of ODT at the different ranks, in accordance with any embodiment described herein. Selective application of ODT can include ODT value and ODT timing settings specific to each rank for a command type and whether or not the rank is the target rank. ODT control 766 can perform ODT timing control in accordance with any embodiment of ODT timing discussed herein.

In one aspect, a memory device with on-die termination (ODT) includes: a hardware interface to couple to a memory bus shared by multiple memory devices organized as ranks of memory; and logic to receive a memory access command on the memory bus, the memory access command directed to a target rank to execute the command, the logic to further selectively engage ODT for the memory access operation in accordance with an ODT latency setting in response to receipt of the memory access command; wherein the ODT latency setting includes a programmable setting to set different ODT timing values for Read and Write transactions.

In one embodiment, the ODT latency setting comprises a timing offset value. In one embodiment, the timing offset value comprises at least one Read ODT timing value, including an offset to adjust turn on time prior to column address select (CAS) latency, an offset to adjust turn off time after CAS latency, or both. In one embodiment, the timing offset value comprises at least one Write ODT timing value, including an offset to adjust turn on time prior to write latency, an offset to adjust turn off time after write latency, or both. In one embodiment, the timing offset value comprises a write latency in addition to a write latency plus a burst length latency, or a CAS latency plus a burst length latency, or both. In one embodiment, the timing offset value comprises an offset value of 1 to 8 clock cycles (tCK). In one embodiment, the ODT latency setting comprises a value programmed based on I/O training between the memory devices and an associated memory controller. In one embodiment, the logic is to selectively engage ODT including to set an ODT latency setting for a non-target rank that does not execute the command. In one embodiment, the logic is to selectively engage ODT in accordance with the programmable ODT latency setting in response to receipt of either a Read or a Write command, without receipt of an accompanying CAS-2 command. In one embodiment, the logic is to selectively engage ODT based on an identifier in command encoding of the memory access command. In one embodiment, the identifier is to identify an ODT timing type. In one embodiment, further comprising: a register to store the ODT latency setting. In one embodiment, the register to store the ODT latency setting comprises a Mode Register to store a Mode Register Set (MRS) setting. In one embodiment, the ODT latency setting includes a programmable setting to set different timing values for different ranks. In one embodiment, the ODT latency setting includes a programmable setting to set different timing values for different DRAM (dynamic random access memory) devices. In one embodiment, the ODT latency setting includes a programmable setting to set different timing values for different channels. In one embodiment, the ODT latency setting includes a programmable setting to set different timing values for different bytes. In one embodiment, the ODT latency setting includes a programmable setting to set different timing values for different nibbles.

In one aspect, a system with on-die termination (ODT) control includes: a memory controller to generate memory access commands; and multiple memory devices coupled to the memory controller, the memory devices organized as ranks of memory, each memory device including logic to receive a memory access command from the memory controller, the memory access command directed to a target rank to execute the command, the logic to further selectively engage ODT (on-die termination) for the memory access operation for one or more non-target ranks in accordance with an ODT latency setting in response to receipt of the memory access command; wherein the ODT latency setting includes a programmable setting to set different ODT timing values for Read and Write transactions.

In one aspect, a method for controlling on-die termination (ODT) includes: receiving a memory access command at a memory device coupled to a memory bus shared by multiple memory devices organized as ranks of memory; determining at the memory device if it is part of a target rank identified by the memory access command; and selectively engaging ODT for the memory access operation for one or more non-target ranks in accordance with an ODT latency setting in response to receiving the memory access command;

wherein the ODT latency setting includes a programmable setting to set different ODT timing values for Read and Write transactions.

In one aspect of the system, the system is to include a memory device in accordance with any embodiment set forth above with respect to the memory device. In one aspect of the method, the method is to include operations in accordance with any embodiment set forth above with respect to the memory device. In one aspect, an article of manufacture comprising a computer readable storage medium having content stored thereon, which when accessed causes the performance of operations to execute a method for controlling ODT in accordance with any embodiment of the method. In one aspect, an apparatus comprising means for performing operations to execute a method for controlling ODT in accordance with any embodiment of the method.

In one aspect, a memory controller to control on-die termination (ODT) includes: a hardware interface to couple to a memory bus shared by multiple memory devices organized as ranks of memory; and logic to send a memory access command on the memory bus, the memory access command directed to a target rank to execute the command, the memory access command to cause a memory device to further selectively engage ODT for the memory access operation in accordance with an ODT latency setting; wherein the ODT latency setting includes a programmable setting to set different ODT timing values for Read and Write transactions.

In one embodiment, the ODT latency setting comprises a timing offset value. In one embodiment, the timing offset value comprises at least one Read ODT timing value, including an offset to adjust turn on time prior to column address select (CAS) latency, an offset to adjust turn off time after CAS latency, or both. In one embodiment, the timing offset value comprises at least one Write ODT timing value, including an offset to adjust turn on time prior to write latency, an offset to adjust turn off time after write latency, or both. In one embodiment, the timing offset value comprises a write latency in addition to a write latency plus a burst length latency, or a CAS latency plus a burst length latency, or both. In one embodiment, the timing offset value comprises an offset value of 1 to 8 clock cycles (tCK). In one embodiment, the ODT latency setting comprises a value programmed based on I/O training between the memory devices and an associated memory controller. In one embodiment, the memory device is to selectively engage ODT including to set an ODT latency setting for a non-target rank that does not execute the command. In one embodiment, the memory device is to selectively engage ODT in accordance with the programmable ODT latency setting in response to receipt of either a Read or a Write command, without receipt of an accompanying CAS-2 command. In one embodiment, the memory device is to selectively engage ODT based on an identifier in command encoding of the memory access command. In one embodiment, the identifier is to identify an ODT timing type. In one embodiment, the memory device further comprises a register to store the ODT latency setting. In one embodiment, further comprising logic to provide an ODT latency setting via a Mode Register Set (MRS) setting for a Mode Register of the memory device. In one embodiment, the ODT latency setting includes a programmable setting to set different timing values for different ranks. In one embodiment, the ODT latency setting includes a programmable setting to set different timing values for different DRAM (dynamic random access memory) devices. In one embodiment, the ODT latency setting includes a programmable setting to set different timing values for different channels. In one embodiment, the ODT latency setting includes a programmable setting to set different timing values for different bytes. In one embodiment, the ODT latency setting includes a programmable setting to set different timing values for different nibbles.

In one aspect, a method for controlling on-die termination (ODT) includes: selecting a target rank for a memory access command; and sending the memory access command to a memory device coupled to a memory bus shared by multiple memory devices organized as ranks of memory, the sending the memory access command to cause the memory device to determine if it is part of the target rank, and selectively engage ODT for the memory access operation in accordance with an ODT latency setting; wherein the ODT latency setting includes a programmable setting to set different ODT timing values for Read and Write transactions.

In one aspect of the second method, the method is to include operations in accordance with any embodiment set forth above with respect to the memory controller. In one aspect, an article of manufacture comprising a computer readable storage medium having content stored thereon, which when accessed causes the performance of operations to execute a method for controlling ODT in accordance with any embodiment of the second method. In one aspect, an apparatus comprising means for performing operations to execute a method for controlling ODT in accordance with any embodiment of the second method.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device with on-die termination (ODT) comprising:
    a hardware interface to couple to a memory bus shared by multiple memory devices;
    an ODT circuit to selectively apply ODT to the hardware interface for a memory access operation in accordance with an ODT latency setting in response to receipt of a memory access command;
    a first addressable register to store a dynamically programmable first ODT latency setting to control ODT turn on timing or turn off timing for a Read operation; and
    a second addressable register separate from the first addressable register to store a dynamically programmable second ODT latency setting to control ODT turn on or turn off timing or turn off timing for a Write operation.

2. The memory device of claim 1, wherein the ODT latency setting comprises a timing offset value.

3. The memory device of claim 2, wherein the timing offset value comprises at least one Read ODT timing value, including an offset to adjust turn on time prior to column address select (CAS) latency, an offset to adjust turn off time after CAS latency, or both.

4. The memory device of claim 2, wherein the timing offset value comprises at least one Write ODT timing value, including an offset to adjust turn on time prior to write latency, an offset to adjust turn off time after write latency, or both.

5. The memory device of claim 2, wherein the timing offset value comprises a write latency in addition to a write latency plus a burst length latency, or a CAS latency plus a burst length latency, or both.

6. The memory device of claim 2, wherein the timing offset value comprises an offset value of 1 to 8 clock cycles (tCK).

7. The memory device of claim 1, wherein the ODT latency setting comprises a value programmed based on I/O training between the memory devices and an associated memory controller.

8. The memory device of claim 1, wherein the ODT circuit is to selectively engage ODT in accordance with the first ODT latency setting or the second ODT latency setting for a non-target rank that does not execute the memory access command.

9. The memory device of claim 1, wherein the ODT circuit is to selectively engage ODT based on an identifier in command encoding of the memory access command.

10. The memory device of claim 9, wherein the identifier is to identify an ODT timing type.

11. The memory device of claim 1, wherein the first and second addressable registers to store the ODT latency settings comprise fields of a Mode Register.

12. A system with on-die termination (ODT) control, comprising:
    a memory controller to generate a memory access command; and
    multiple memory devices coupled to the memory controller, a memory device including
        an ODT circuit to selectively apply ODT for a memory access operation in accordance with an ODT latency setting in response to receipt of the memory access command;
        a first addressable register to store a dynamically programmable first ODT latency setting to control ODT turn on timing or turn off timing values for a Read operation; and
        a second addressable register separate from the first addressable register to store a dynamically programmable second ODT latency setting to control ODT turn on or turn off timing or turn off timing for a Write operation.

13. The system of claim 12, wherein the first and second ODT latency settings comprise an ODT latency setting including a timing offset value, wherein the timing offset value includes at least one of:
    a Read ODT timing value, including an offset to adjust turn on time prior to column address select (CAS) latency, an offset to adjust turn off time after CAS latency, or both;
    a Read ODT timing value, including an offset to adjust turn off time after CAS latency plus burst length latency;
    a Write ODT timing value, including an offset to adjust turn on time prior to write latency, an offset to adjust turn off time after write latency, or both; or
    a Write ODT timing value, including an offset to adjust turn off time after write latency plus burst length latency.

14. The system of claim 12, wherein the ODT circuit is to selectively engage ODT based on an identifier in command encoding of the memory access command to identify an ODT timing type.

15. The system of claim 12, wherein the first and second addressable registers to store the ODT latency settings comprise fields of a Mode Register.

16. The system of claim 12, wherein the first and second ODT latency settings comprise an ODT latency setting including a programmable setting to set different timing values for one or more of: different ranks, different DRAM (dynamic random access memory) devices, different channels, different bytes, or different nibbles.

17. The system of claim 12, further comprising:
    one or more processors communicatively coupled to the memory controller; and
    a network interface communicatively coupled to the one or more processors.

18. A method for controlling on-die termination (ODT) comprising:
    receiving a memory access command at a memory device coupled to a memory bus shared by multiple memory devices;

selectively engaging ODT with an ODT circuit to selectively apply ODT for a memory access operation in accordance with an ODT latency setting in response to receiving the memory access command; and reading a first addressable register for a dynamically programmable first ODT latency setting to control ODT turn on timing or turn off timing values for a Read operation; or reading a second addressable register separate from the first addressable register for a dynamically programmable second ODT latency setting to control ODT turn on or turn off timing or turn off timing for a Write operation.

19. The method of claim 18, wherein the first and second ODT latency settings comprise an ODT latency setting including a timing offset value, wherein the timing offset value includes at least one of:

a Read ODT timing value, including an offset to adjust turn on time prior to column address select (CAS) latency, an offset to adjust turn off time after CAS latency, or both; or a Write ODT timing value, including an offset to adjust turn on time prior to write latency, an offset to adjust turn off time after write latency, or both.

20. The method of claim 18, wherein selectively engaging ODT further comprises reading an identifier in command encoding of the memory access command to identify an ODT timing type.

21. The method of claim 18, wherein reading the first addressable register or reading the second addressable register comprises reading a mode register that stores the ODT latency setting.

22. The method of claim 21, wherein the first and second ODT latency settings comprise ODT latency settings per device or per rank.

* * * * *